United States Patent
Wu et al.

(10) Patent No.: US 10,249,791 B2
(45) Date of Patent: Apr. 2, 2019

(54) HIGH-BRIGHTNESS LIGHT-EMITTING DIODE WITH SURFACE MICROSTRUCTURES

(71) Applicant: XIAMEN SANAN OPTOELECTRONICS TECHNOLOGY CO., LTD., Xiamen (CN)

(72) Inventors: Chaoyu Wu, Xiamen (CN); Kunhuang Cai, Xiamen (CN); Yi-An Lu, Xiamen (CN); Chun-Yi Wu, Xiamen (CN); Ching-Shan Tao, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 119 days.

(21) Appl. No.: 15/284,917

(22) Filed: Oct. 4, 2016

(65) Prior Publication Data
US 2017/0025577 A1    Jan. 26, 2017

Related U.S. Application Data

(63) Continuation of application No. PCT/CN2015/070387, filed on Jan. 9, 2015.

(30) Foreign Application Priority Data

Apr. 8, 2014  (CN) .......................... 2014 1 0138259

(51) Int. Cl.
*H01L 21/00*  (2006.01)
*H01L 33/30*  (2010.01)
(Continued)

(52) U.S. Cl.
CPC ............ *H01L 33/305* (2013.01); *H01L 22/12* (2013.01); *H01L 33/0062* (2013.01);
(Continued)

(58) Field of Classification Search
CPC ... H01L 33/305; H01L 22/12; H01L 33/0062; H01L 33/22; H01L 2933/0016; H01L 33/405; H01L 33/06
See application file for complete search history.

(56) References Cited

U.S. PATENT DOCUMENTS

2007/0126312 A1*  6/2007  Sung .................. H01J 1/304
                                                    310/306
2011/0193119 A1*  8/2011  Chen .................. H01L 33/46
                                                    257/98
2016/0320689 A1*  11/2016  Butterworth ........... H01L 33/58

FOREIGN PATENT DOCUMENTS

CN           102447020 A       5/2012
CN           102683513 A       9/2012

* cited by examiner

*Primary Examiner* — Charles D Garber
*Assistant Examiner* — Abdulfattah Mustapha
(74) *Attorney, Agent, or Firm* — Syncoda LLC; Feng Ma

(57) ABSTRACT

A high-brightness light-emitting diode with surface microstructure and preparation and screening methods thereof are provided. The ratio of total roughened surface area of light transmission surface of a light emitting diode to vertically projected area is greater than 1.5, and the peak density of light transmission surface is not less than $0.3/um^2$. The higher the ratio of total roughened surface area of an epitaxial wafer to vertically projected area and the higher the number of peak over the critical height within a unit area, the more beneficial to improve light extraction efficiency of the epitaxial wafer. As a result, light extraction efficiency of the epitaxial wafer is greatly improved.

11 Claims, 4 Drawing Sheets

(51) Int. Cl.
  *H01L 33/22*  (2010.01)
  *H01L 21/66*  (2006.01)
  *H01L 33/00*  (2010.01)
  *H01L 33/06*  (2010.01)
  *H01L 33/40*  (2010.01)
(52) U.S. Cl.
  CPC .............. *H01L 33/22* (2013.01); *H01L 33/06* (2013.01); *H01L 33/405* (2013.01); *H01L 2933/0016* (2013.01)

HIGH-BRIGHTNESS LIGHT-EMITTING DIODE WITH SURFACE MICROSTRUCTURES

CROSS-REFERENCE TO RELATED APPLICATIONS

The present application is a continuation of, and claims priority to, PCT/CN2015/070387 filed on Jan. 9, 2015, which claims priority to Chinese Patent Application No. 201410138259.2 filed on Apr. 8, 2014. The disclosures of these applications are hereby incorporated by reference in their entirety.

BACKGROUND

Light-emitting diode is a semiconductor P-N junction diode; when a forward voltage is applied to both ends of a P-N junction, the current carriers are excited from low-energy state to high-energy state and are in an unstable state, and when the carriers return to low-energy state and recombination is to occur, according to the conservation of energy theorem, excessive energy is released in the form of photons. External quantum efficiency of light emitting diode is the key to improve the light emitting diode luminous efficiency, and depends on the internal quantum efficiency of epitaxial materials and the light extraction efficiency of epitaxial wafer. Now breakthroughs have been made in precise control of epitaxial growth, doping concentration and reduction of dislocations, and internal quantum efficiency of light emitting diode has been already very high, therefore, the light extraction efficiency of epitaxial wafer will determine the luminous efficiency of light emitting diode to a great extent.

SUMMARY

Light extraction efficiency of epitaxial wafers is typically increased by roughening the surface which reduces the reflection by light diffusion while causing no damage to the electrical and optical properties of the material. Surface roughening mainly functions to increase the transmittance; it changes the direction of the light meeting total reflection law, then in another surface the light transmits the interface when emitting back to the original surface, thus preventing reflecting. Reflection path of photons is enclosed in the surface micro structure, therefore, the photons emitted by the active layer can be effectively extracted. Common types of roughening include periodic roughening and random roughening. The latter is usually to control the roughness of the light emitting surface by chemical etching method so to break the total reflection effect of light emitting surface.

The inventors of the present disclosure have realized that the quality of the product prepared by the widespread chemical roughening is not as high as expected, and no direct method for determining whether epitaxial wafer has a high luminous intensity is available, and instead, optimization conditions are decided generally based on several groups of luminance data from try & error tests under different process conditions, which cannot determine whether a roughened surface structure has been at a state most conducive to light extraction, and therefore, the capability to define the surface microstructure will be very beneficial to improve the quality of light emitting diode products.

Some embodiments of the present disclosure aim to provide a high brightness light emitting diode with surface microstructure and preparation method and screening method thereof, so as to improve the yield of high brightness light emitting diode, while addressing the problem of failing to determine the quality of the surface microstructure existing in the prior art.

To solve the above problems, the following technical scheme is adopted according to some embodiments: a high brightness light emitting diode with a surface microstructure, the light transmission surface of the light emitting diode has a surface microstructure, and the ratio of total roughened surface area of light transmission surface of a light emitting diode to vertically projected area is not less 1.5.

Further, the peak density of the light transmission surface is not less than $0.3/um^2$.

Further, the layer of the light transmission surface is Al doped GaInP layer or Mg doped GaP layer, and in Al doped GaInP layer, the mol ratio of Al to GaInP is 0.67-1.5.

A preparation method of the high brightness light emitting diode is provided, and the preparation process of the surface microstructure of the light emitting diode comprises the following steps:

(1) have the light transmission surface of the epitaxial wafer of the light emitting diode requiring roughening exposed, and protect the light transmission surface requiring no roughening with photoresist or metal;

(2) prepare roughening solution as per the following dose proportion in weight percentage and with the following components:

| | |
|---|---|
| $CH_3COOH$ | 30~50% |
| HF | 40~60% |
| $H_2SO_4$ | 0~2% |
| $HNO_3$ | 0~20% |
| $H_3PO_4$ | 0~10% |

(3) dip the epitaxial wafer processed by Step (1) in the roughening solution prepared by Step (2) for 1-8 min and then take out and dry the epitaxial wafer for subsequent preparation of said light emitting diode with surface microstructure.

Further, the epitaxial wafer processed by Step (1) comprises a high reflection metal surface with electric contact and mirror system, and bonding metal is evaporated over said mirror system and achieves the bonding effect by the application of high temperature and high pressure.

Further, the high temperature is 250-350° C. and the high pressure is 60-200 KPa.

A method to screen the high brightness light emitting diode is provided, comprising the following steps:

(1) select epitaxial wafer with surface roughened;

(2) measure the total roughened surface area of the light transmission surface on the epitaxial wafer chosen in Step (1);

(3) calculate the ratio of total roughened surface area to vertically projected area;

(4) screen the epitaxial wafers with the ratio of total roughened surface area to vertically projected area being not less than 1.5;

(5) prepare light emitting diodes with the epitaxial wafers screened by Step (4).

Further, the preparation method of epitaxial wafer is: depositing in order above an epitaxial substrate a buffer layer, an n-electrical cladding, an n-cladding, a multilayer quantum well structure (MQW), a p-cladding and a p-electrical cladding so to finish the growth of epitaxial layer structure.

Further, the preparation method of a light emitting diode with surface microstructure and with the n-cladding on the top based on the epitaxial wafer prepared by the above method comprises the following steps:

(1) fabricate a highly reflective metal surface with electric contact and mirror system on the p-electrical cladding of the epitaxial wafer, and a dielectric layer can be added to prepare an omnibearing reflective mirror system to improve reflectivity;

(2) evaporate bonding metal over the mirror system and have the bonding metal fit with a conductive substrate and then high temperature and high pressure are applied to realize bonding effect;

(3) When the bonding is completed, remove the epitaxial substrate by etching till the n-electrical cladding is exposed;

(4) fabricate N electrode on the exposed epitaxial layer and define a main light emitting area;

(5) have the surface of the n-electrical cladding requiring roughening exposed, and protect the surface requiring no roughening with photoresist or metal, including the vicinity of the electrode and the main light emitting area, to finally obtain roughening pretreated wafer;

(6) prepare roughening solution containing the solutions of $CH_3COOH$, $HF$, $H_2SO_4$, $HNO_3$ and $H_3PO_4$ in different dosage;

(7) dip the roughening pretreated wafer processed by Step (5) in the roughening solution prepared by Step (6) for 2-3 min. and then take it out, and the light emitting diode with surface microstructure and with n-cladding on the top, also called surface roughened epitaxial wafer, is obtained.

The present disclosure also provides a method to screen the above high brightness light emitting diode, comprising the following steps:

(1) select epitaxial wafer with surface roughened;

(2) measure the total roughened surface area of the light transmission surface on the epitaxial wafer chosen in Step (1);

(3) calculate the ratio of total roughened surface area to vertically projected area;

(4) screen the epitaxial wafers with the ratio of total roughened surface area to vertically projected area not less than 1.5;

(5) prepare light emitting diodes with the epitaxial wafers screened by Step (4).

The surface microstructure of the light-emitting diode according to some embodiments disclosed herein can be obtained by surface roughening by chemical solution, that is, a roughened surface is formed on the epitaxial wafer of the light emitting diode; surface roughening is beneficial to improve light extraction efficiency of the epitaxial wafer, and the steep the facial angle of the surface microstructure and the more peak number on the surface is, the more easily the light shot below in various angles is transmitted through the surface microstructure, thus improving light extraction efficiency; poorly roughened surface has gentle and sparse facial angle, which easily reflects small-angle light or right-angle light back to the inside of the structure, and accordingly, light extraction efficiency is decreased.

Some embodiments disclosed herein define the surface microstructure of the light emitting diode epitaxial wafer and find out the relation between the optimal light intensity and the surface microstructure of the epitaxial wafer, the details of which comprise the following three aspects:

(1) The higher the number of peak over the critical height within a unit area on the epitaxial wafer is, the more beneficial is to improve the light extraction efficiency of the epitaxial wafer, and especially when the peak density of the roughened surface of the epitaxial wafer is not less than $0.3/\mu m^2$, light extraction efficiency of the epitaxial wafer is greatly improved and the luminance of the light emitting diode is increased;

(2) The higher the ratio of total roughened surface area to an epitaxial wafer according to some embodiments of the present disclosure to vertically projected area is, the more beneficial is to improve the light extraction efficiency of the epitaxial wafer, and especially when the ratio of total roughened surface area of to vertically projected area is not less than 1.5, light extraction efficiency of the epitaxial wafer is greatly improved;

(3) The n-cladding of the epitaxial wafer is Al doped GaInP layer, and the mol ratio of Al to GaInP is between 1.4 and 1.6, and so chemical roughening method can help obtain good surface microstructure, that is, light extraction efficiency of the epitaxial wafer can be greatly improved.

The screening method according to some embodiments disclosed herein can make direct judgement of the quality of the light intensity by the roughness of light transmission surface, and is characterized by high screening accuracy and efficiency.

In another aspect, a light-emitting system is provided including a plurality of LEDs described above. The light-emitting system can be, for example, a display, a signage, a lighting apparatus, etc.

DETAILED DESCRIPTION

Figure 1:
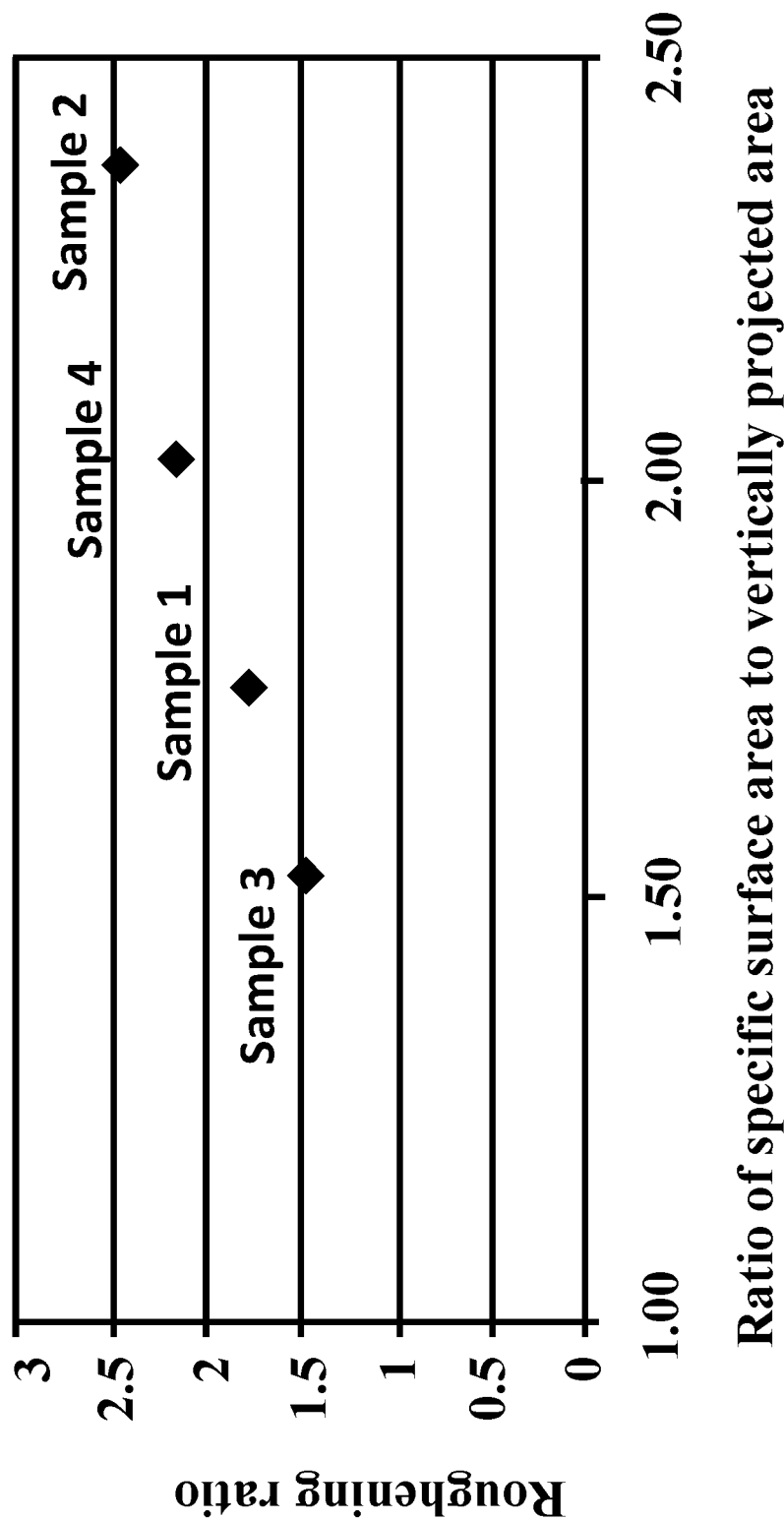
FIG. 1 is a scatter plot of data related to the change of roughening ratio of samples 1-4 with that of the ratio of specific surface area to vertically projected area.
Figure 2:
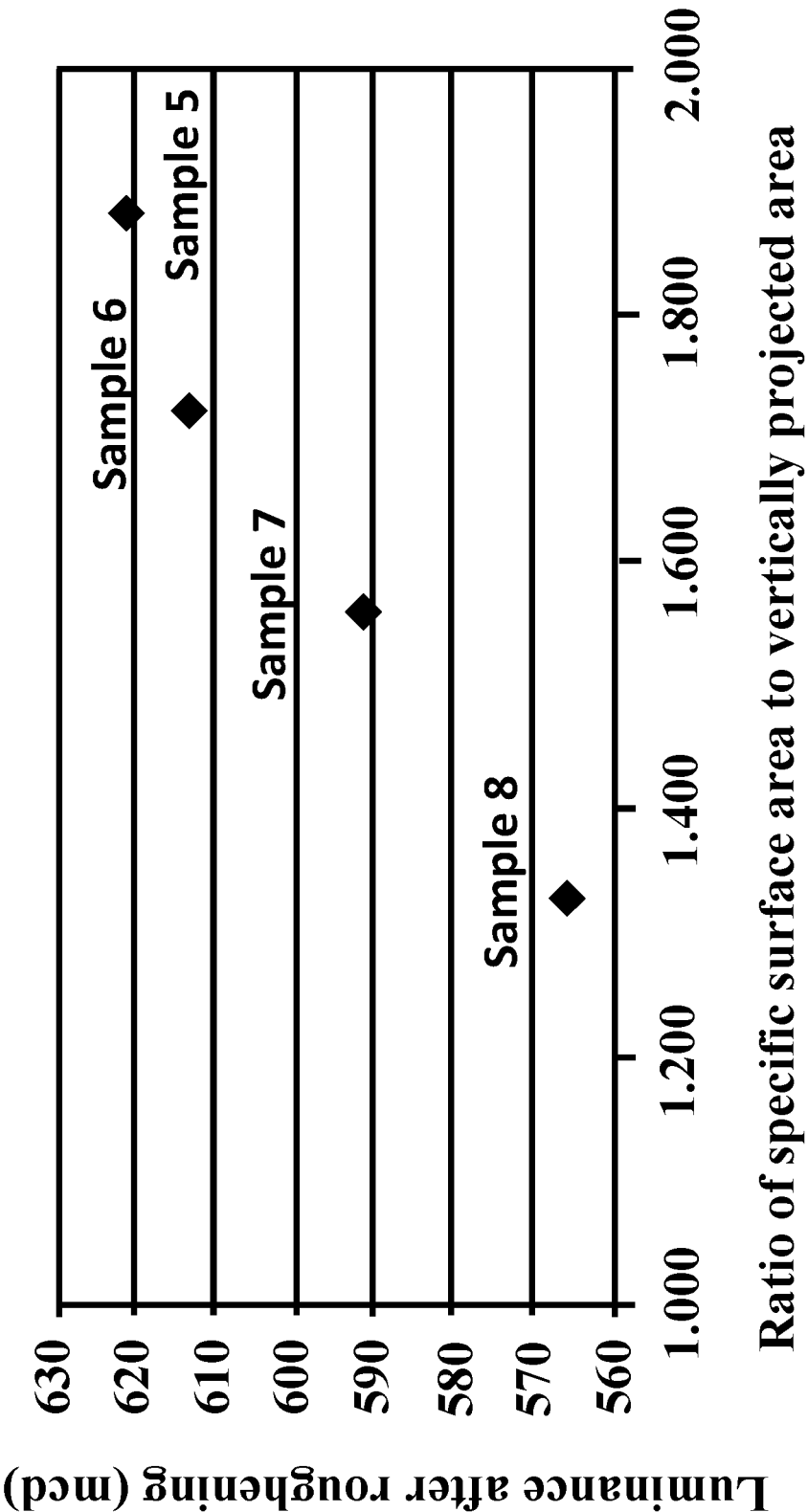
FIG. 2 is a scatter plot of data related to the change of brightness after roughening of samples 5-8 with that of the ratio of specific surface area to vertically projected area.
Figure 3:
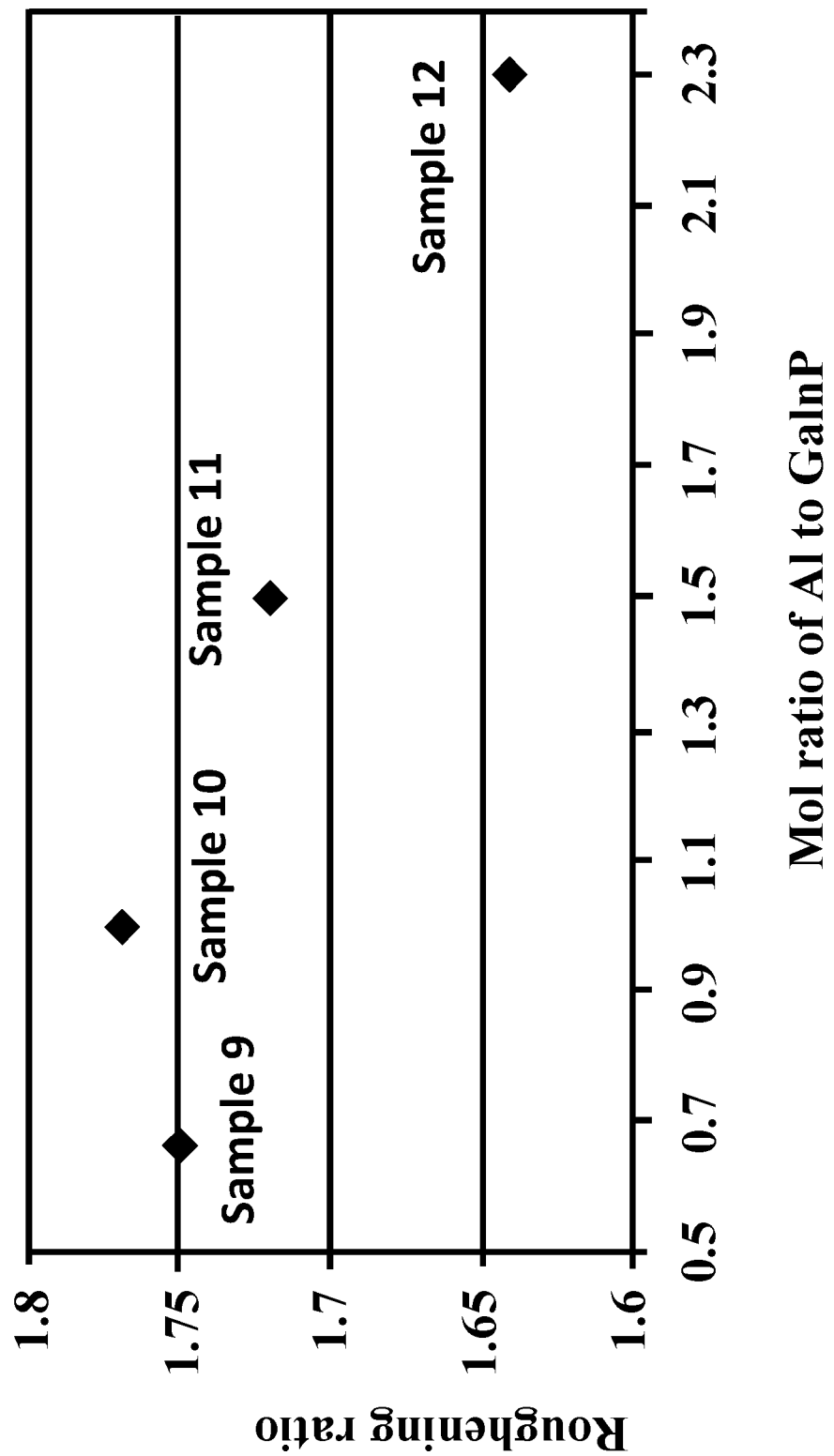
FIG. 3 is a scatter plot of data related to the change of roughening ratio of samples 9-12 with that of the dosage of Al doped.
Figure 4:
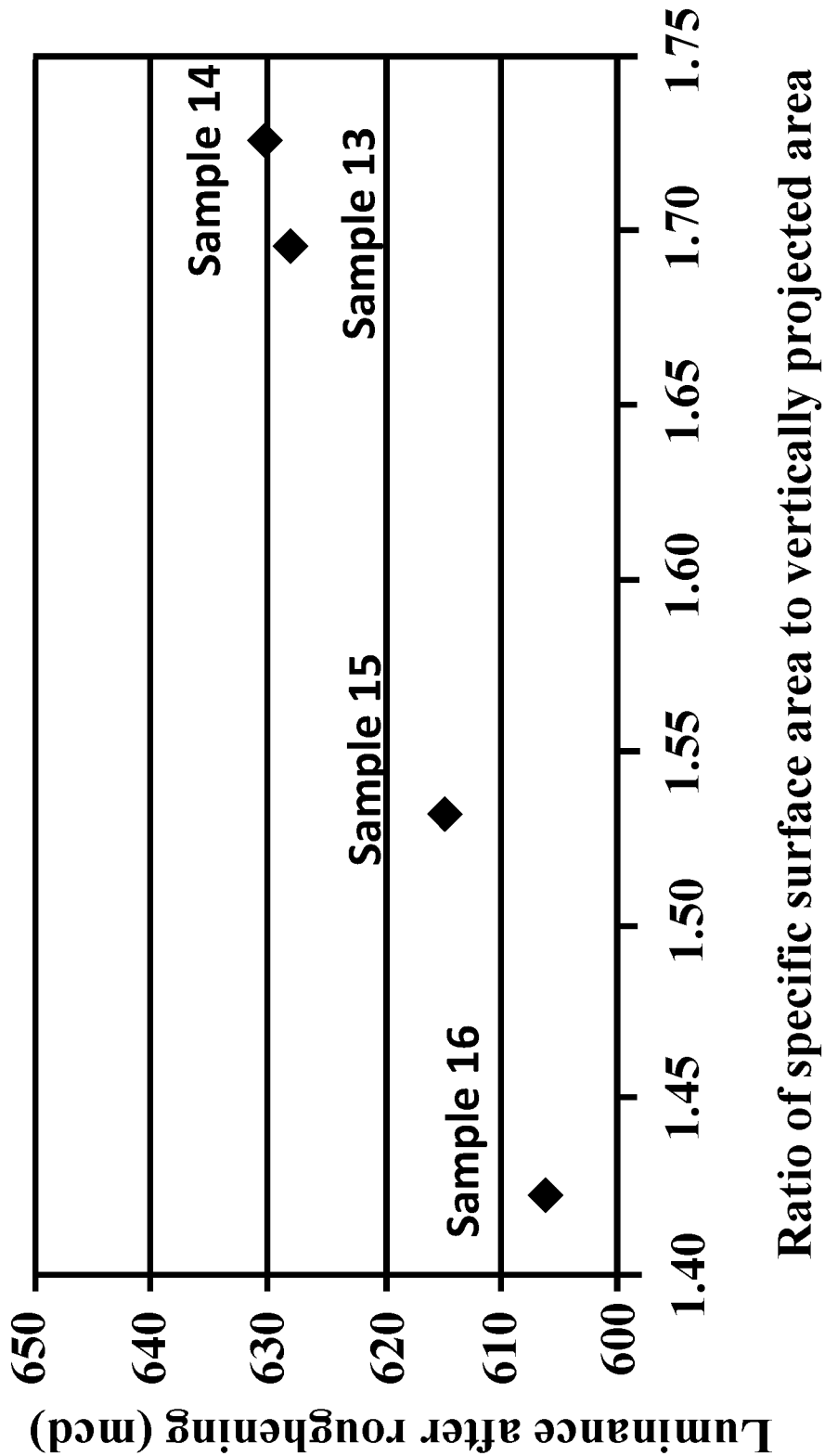
FIG. 4 is a scatter plot of data related to the change of brightness after roughening of samples 13-16 with that of the ratio of specific surface area to vertically projected area.

In some embodiments, the roughened surface of the epitaxial wafer after roughening is just the surface with microstructure, and the total roughened surface area of the epitaxial wafer is also called specific surface area. In some the embodiments of the disclosure, the equipment used for testing the light intensity of samples is BRUKER AFM, and the single-point probe test is performed at 20-350 mA.

The pretreatment of the epitaxial wafer prior to roughening comprises the following steps according to some embodiments:

(1) fabricate a high reflection metal surface with electric contact and mirror system on the p-electrical cladding of the epitaxial wafer, and a dielectric layer can be added to prepare an omnibearing reflective mirror system to improve reflectivity;

(2) evaporate bonding metal over the mirror system and have the bonding metal fit with a conductive substrate and then high temperature and high pressure are applied to realize bonding effect;

(3) following the bonding, remove the epitaxial substrate by etching till the n-electrical cladding is exposed;

(4) fabricate N electrode on the exposed epitaxial layer and define a main light emitting area; a wafer ready for roughening is finally formed.

Embodiment 1

Four samples are prepared for Embodiment 1, and all are the light emitting diode with surface microstructure and with n-cladding on the top and share the basically same structure, and the same growth method of the epitaxial wafer: depositing a buffer layer and a n-electrical cladding over the epitaxial substrate and then a n-cladding, further depositing a multilayer quantum well (MQW) structure above the n-cladding, followed by a p-cladding deposited on the MQW structure and finally an electrical cladding, thereby completing the growth of the epitaxial layer structure; the difference between the samples 1-4 is that each respective functional layer is made of different materials, so that samples 1-4 emits light with different wavelengths, and the components of specific functional layers of samples 1-4 are provided in Table 1 below:

TABLE 1

Components of functional layers of samples 1-4

| | | | Layer Material | | | |
|---|---|---|---|---|---|---|
| No. | Substrate | Buffer layer | N-electrical cladding | n-cladding | MQW | p-cladding |
| Sample 1 | GaAs | GaAs | n-GaAs | n-AlGaInP | InGaP/AlGaInP | p-GaP |
| Sample 2 | GaAs | GaAs | n-GaAs | n-AlGaInP | AlGaInP/AlGaInP | p-GaP |
| Sample 3 | GaAs | GaAs | n-GaAs | n-AlGaAs | AlGaAs/AlGaAs | p-GaP |
| Sample 4 | $Al_2O_3$ | AlN | — | n-GaN | InGaN/GaN | p-GaN |

After completion of the growth of the epitaxial wafer of samples 1-4, the epitaxial wafer can be prepared into the wafer ready for roughening and finally perform surface roughening to form samples 1-4 with surface microstructure.

The roughening of samples 1-4 is basically the same, all comprising the following steps:

(1) have the light transmission surface of samples 1-4 requiring roughening exposed, and protect the light transmission surface requiring no roughening with photoresist or metal;

(2) prepare the first roughening solution in weight percentage and with the following components:

| | |
|---|---|
| $CH_3COOH$ | 30% |
| HF | 60% |
| $H_2SO_4$ | 2% |
| $HNO_3$ | 5% |
| $H_3PO_4$ | 3% |

Prepare the second roughening solution with a concentration of 40% NaOH.

(3) dip the sample 1-3 processed by Step (1) in the first roughening solution prepared by Step (2) for 2 min., dip sample 4 in the second roughening solution for 2 min. and then take out and dry samples 1-4 respectively for subsequent preparation of the light emitting diode with surface microstructure. Luminous intensity tests have been carried out to samples 1-4 and the testing results are shown in Table 2:

TABLE 2

Measurements and luminescence property of the surface microstructure of samples 1-4

| | No. | | | |
|---|---|---|---|---|
| Measurements | Sample 1 | Sample 2 | Sample 3 | Sample 4 |
| Specific surface area ($\mu m^2$) | 175 | 237 | 153 | 202 |
| Ratio of specific surface area to vertically projected area (100 $\mu m^2$) | 1.75 | 2.37 | 1.53 | 2.02 |
| Average critical height of roughened surface (nm) | 662 | 711 | 452 | 683 |
| No. of peak over average critical height | 58 | 62 | 31 | 65 |
| Peak density | 0.58 | 0.62 | 0.31 | 0.65 |
| Brightness before roughening | 383 mcd | 88 mW | 108 mW | 223 mW |
| Brightness after roughening | 678 mcd | 217 mW | 160 mW | 480 mW |
| Roughening ratio = mcd before roughening/mcd after roughening | 1.77 | 2.46 | 1.48 | 2.15 |

As influenced by the sensitivity of human eyes towards wavelength, the brightness of the light of different wavelengths also differs, and therefore, the absolute value of the brightness of the light of different wavelengths cannot be directly compared. In this Embodiment 1, the quality of the roughened surface should be judged by the roughening ratios before and after roughening, and as revealed in the above Table 2, the sample with higher roughening ratio has a higher ratio of specific surface area to vertically projected area, that is, the higher the roughening ratio is, the better the roughening effect of the sample is, and in turn, the higher the ratio of specific surface area to vertically projected area is, the higher the ratio of brightness before and after roughening is, and the present disclosure considers that when the ratio of total roughened surface area to vertically projected area of a sample is not less than 1.5, the sample has a good light intensity, and therefore, this method can be applied to screen high brightness light emitting diode.

Embodiment 2

Four samples are prepared for Embodiment 2, namely, samples 5-8, and share a same preparation method, specifically: depositing a buffer layer (GaAs) and an electrical cladding over the epitaxial substrate and then a n-cladding (n-GaAs), further depositing a multilayer quantum well (MQW) structure (InGaP/AlGaInP) above the n-cladding, followed by a p-cladding (p-GaP) deposited on the MQW structure and finally an electrical cladding, thereby completing the growth of the epitaxial layer structure; after the completion of the growth of the epitaxial wafer of samples 5-8, the epitaxial wafer can be prepared into the wafer ready for roughening and finally perform surface roughening to form samples 5-8 with surface microstructure.

The roughening of samples 5-8 is basically the same, all comprising the following steps:

(1) have the light transmission surface of samples 5-8 requiring roughening exposed, and protect the light transmission surface requiring no roughening with photoresist or metal;

(2) prepare roughening solution as per the following dose proportion in weight percentage and with the following components: 30% $CH_3COOH$, 60% HF, 2% $H_2SO_4$, 5% $HNO_3$ and 3% $H_3PO_4$;

(3) dip the samples 5-8 processed by Step (1) in the roughening solution prepared by Step (2) and then take out and dry samples 13-16 for subsequent preparation of the light emitting diode with surface microstructure.

The difference between the samples 5-8 is that the roughening time of samples 5-8 in Step (3) gradually shortens, 3 min. for sample 5, 2.5 min. for sample 6, 2 min. for sample 7 and 1.5 min. for sample 8.

Luminous intensity tests have been carried out to samples 5-8 and the testing results are shown in Table 3:

TABLE 3

Measurements of the surface microstructure of samples 5-8

| Measurements | Sample 5 | Sample 6 | Sample 7 | Sample 8 |
|---|---|---|---|---|
| Specific surface area ($\mu m^2$) | 188 | 172.2 | 156.1 | 132.8 |
| Ratio of specific surface area to vertically projected area (100 $\mu m^2$) | 1.88 | 1.722 | 1.561 | 1.328 |
| Average critical height of roughened surface (nm) | 646 | 563 | 463 | 359 |
| No. of peak over average critical height | 55 | 60 | 51 | 47 |
| Peak density ($\mu m^{-2}$) | 0.55/$um^2$ | 0.6/$um^2$ | 0.51/$um^2$ | 0.47/$um^2$ |
| Brightness before roughening (mcd) | 365 | 365 | 365 | 365 |
| Brightness after roughening (mcd) | 620.5 | 613.2 | 591.3 | 565.7 |
| Roughening ratio = mcd before roughening/mcd after roughening | 1.70 | 1.68 | 1.62 | 1.55 |

The data from Tables 2 and 3 show that the light intensity of the epitaxial wafer has little to do with the material of the epitaxial wafer itself, but mainly related to microstructure of the light transmission surface of the epitaxial wafer, and the light intensity of the epitaxial wafer increases with the ratio of specific surface area to vertically projected area of the light transmission area, especially when the ratio is not less than 1.5 as well as that the peak density of the sample is not less than 0.34 $\mu m^2$, the epitaxial wafer has a high light intensity.

Embodiment 3

Four samples are prepared for Embodiment 3, namely, samples 9-12 and all are of epitaxial wafer in vertical structure, and share a same preparation method, specifically: depositing a buffer layer (GaAs) and an electrical cladding over the epitaxial substrate and then a n-cladding ($Al_x$ $(GaInP)_x$), further depositing a multilayer quantum well (MQW) structure (InGaP/AlGaInP) above the n-cladding, followed by a p-cladding (p-GaP) deposited on the MQW structure and finally an electrical cladding, thereby completing the growth of the epitaxial layer structure; after the completion of the growth of the epitaxial wafer of samples 9-12, the epitaxial wafer can be prepared into the wafer ready for roughening and finally perform surface roughening to form samples 9-12 with surface microstructure.

The roughening of samples 9-12 is basically the same, all comprising the following steps:

(1) have the light transmission surface of samples 9-12 requiring roughening exposed, and protect the light transmission surface requiring no roughening with photoresist or metal;

(2) prepare roughening solution as per the following dose proportion in weight percentage and with the following components: 30% $CH_3COOH$, 60% HF, 2% $H_2SO_4$, 5% $HNO_3$ and 3% $H_3PO_4$;

(3) dip the samples 9-12 processed by Step (1) in the roughening solution prepared by Step (2) and then take out and dry samples 13-16 for subsequent preparation of the light emitting diode with surface microstructure.

The difference between samples 9-12 is that the dose proportion of Al in the epitaxial layer structure is different; the roughened n-cladding layer is made of GaInP, and Al doped GaInP is a material combining III-V elements, and by controlling the proportion of family III Al and family V GaInP during the growth process of the epitaxial structure, samples 9-12 are obtained. Specific contents of Al are shown in Table 4:

Luminous intensity tests have been carried out to samples 9-12 and the testing results are shown in Table 4:

TABLE 4

Testing results of components and properties of n-cladding of samples 9-12

| | | Measurements | | |
|---|---|---|---|---|
| No. | n-cladding material component | Luminance before roughening (mcd) | Luminance after roughening (mcd) | Ratio of luminance after roughening to before roughening |
| Sample 9 | $Al_{0.4}(GaInP)_{0.6}$ | 271 | 475 | 1.75 |
| Sample 10 | $Al_{0.5}(GaInP)_{0.5}$ | 280 | 495 | 1.77 |
| Sample 11 | $Al_{0.6}(GaInP)_{0.4}$ | 285 | 489 | 1.72 |
| Sample 12 | $Al_{0.7}(GaInP)_{0.3}$ | 262 | 430 | 1.64 |

As shown in Table 4 above, when the mol ratio of Al to GaInP is between 0.67 and 1.5, the light intensities of the samples are high.

TABLE 5

Characterization data of roughened surface of samples 9-12

| | Measurements | | | |
|---|---|---|---|---|
| No. | Specific surface area ($\mu m^2$) | Ratio of specific surface area to vertically projected area (100 $\mu m^2$) | No. of peak over average critical height | Peak density |
| Sample 9 | 167 | 1.67 | 52 | 0.52 |
| Sample 10 | 184 | 1.84 | 58 | 0.58 |
| Sample 11 | 155 | 1.55 | 49 | 0.49 |
| Sample 12 | 123 | 1.23 | 41 | 0.41 |

The data from Tables 4 and 5 show that light intensities of samples 9-11 are high, especially that of sample 10 is as high as 495 mcd, and property data results in Table 4 are consistent with the samples in Table 5 selected by the screening method based on that the ratio of specific surface area to vertically projected area of the light transmission surface is not less than 1.5, indicating that the screening method provided according to some embodiments of the present disclosure is proper.

Embodiment 4

Four samples are prepared for Embodiment 2, namely, samples 13-16, and share the same component structure and preparation method, specifically: depositing a buffer layer (GaAs) and an electrical cladding over the epitaxial substrate and then a n-cladding ($Al_{0.5}(GaInP)_{0.5}$), further depositing a multilayer quantum well (MQW) structure (InGaP/ AlGaInP) above the n-cladding, followed by a p-cladding (p-GaP) deposited on the MQW structure and finally a p-electrical cladding, thereby completing the growth of the epitaxial layer structure; after the completion of the growth of the epitaxial wafer of samples 13-16, the epitaxial wafer can be prepared into the wafer ready for roughening and finally perform surface roughening to form samples 13-16 with surface microstructure.

The roughening of samples 13-16 is basically the same, all comprising the following steps:

(1) have the light transmission surface of samples 13-16 requiring roughening exposed, and protect the light transmission surface requiring no roughening with photoresist or metal;

(2) prepare roughening solution as per the following dose proportion in weight percentage and with the following components:

| | |
|---|---|
| $CH_3COOH$ | 30~50% |
| HF | 40~60% |
| $H_2SO_4$ | 0~2% |
| $HNO_3$ | 0~20% |
| $H_3PO_4$ | 0~10% |

(3) dip the samples 13-16 processed by Step (1) in the roughening solution prepared by Step (2) and then take out and dry samples 13-16 for subsequent preparation of the light emitting diode with surface microstructure.

The difference between samples 13-16 is that the dose proportion of roughening solutions for processing the samples by the preparation method for the surface microstructure varies. See Table 6 for the specific dose proportion:

TABLE 6

Dose proportion of roughening solution for samples 13-16

| | Solution dose proportion | | | | |
|---|---|---|---|---|---|
| No. | $CH_3COOH$ | HF | $H_2SO_4$ | $HNO_3$ | $H_3PO_4$ |
| Sample 13 | 50% | 50% | 0% | 0% | 0% |
| Sample 14 | 40% | 60% | 0% | 0% | 0% |
| Sample 15 | 30% | 60% | 2% | 5% | 3% |
| Sample 16 | 40% | 40% | 2% | 10% | 8% |

Luminous intensity tests have been carried out to samples 13-16 and the testing results are shown in Table 7:

TABLE 7

Measurements of samples 13-16

| No. | Luminance before roughening (mcd) | Luminance after roughening (mcd) | Roughening ratio = mcd before roughening/ mcd after roughening | Spec. surface area ($\mu m^2$) | Ratio of specific surface area to vertically projected area (100 $\mu m^2$) | No. of peak over average critical height | Peak density ($\mu m^{-2}$) |
|---|---|---|---|---|---|---|---|
| Sample 13 | 375 | 628 | 1.68 | 169.6 | 1.696 | 55 | 0.55 |
| Sample 14 | 377 | 630 | 1.68 | 172.6 | 1.726 | 53 | 0.53 |
| Sample 15 | 372 | 615 | 1.65 | 153.3 | 1.533 | 58 | 0.58 |
| Sample 16 | 373 | 606 | 1.63 | 142.2 | 1.422 | 52 | 0.52 |

As revealed by Table 7, n-cladding layer made of Al (GaInP) can obtain good roughening effect with roughening solutions with different dose proportions, improving the quality of the epitaxial wafer.

A method to screen the high brightness light emitting diode, comprising the following steps:

(1) select epitaxial wafer with surface roughened;

(2) measure the total roughened surface area of the light transmission surface on the epitaxial wafer chosen in Step (1);

(3) calculate the ratio of total roughened surface area to vertically projected area;

(4) screen the epitaxial wafers with the ratio of total roughened surface area to vertically projected area not less than 1.5;

(5) prepare light emitting diodes with the epitaxial wafers screened by Step (4).

Samples selected among the 16 samples in the above embodiments 1-4 by the above screening method are: sample 1, sample 2, sample 3, sample 4, sample 5, sample 6, sample 7, sample 9, sample 10, sample 11, sample 12, sample 13, sample 14 and sample 15, consistent with the results of luminance testing, that is, all the epitaxial wafers with the ratio of total roughened surface area to vertically projected area not less than 1.5 have higher light intensity under the same embodiment; further, the screening method based on that the peak density of the light transmission surface is not less than 0.3/$um^2$ can also be employed, and the screening result is that: sample 1, sample 2, sample 3, sample 4, sample 5, sample 6, sample 7, sample 9, sample 10, sample 11, sample 12, sample 13, sample 14 and sample 15, consistent with the results by the screening method based on that the ratio of total roughened surface area to vertically projected area is not less than 1.5, indicating that both the two screening methods are accurate, and can be employed separately for screening high brightness light emitting diode.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of making a high-brightness light-emitting diode (LED), the method comprising:
   (1) exposing a light-emitting surface of an epitaxial wafer of the LED to be roughened, and protecting the light-emitting surface not-to-be roughened with a photoresist or metal;
   (2) preparing a roughening solution based on dose proportions in weight percentages as:

| | |
|---|---|
| $CH_3COOH$ | 30~50% |
| HF | 40~60% |
| $H_2SO_4$ | 0~2% |
| $HNO_3$ | 0~20% |
| $H3PO4$ | 0~10% |

(3) dipping the epitaxial wafer processed by Step (1) in the roughening solution prepared by Step (2) for 1-8 min;
   wherein for the resulting LED:
   the light-emitting surface has a surface microstructure; and
   a ratio of total roughened surface area of the light-emitting surface to a vertically-projected area is not less 1.5.

2. The method of 1, further comprising: drying the epitaxial wafer for subsequent preparation of the LED.

3. The method of claim 1, wherein:
   the epitaxial wafer processed by Step (1) comprises a high reflection metal surface with electric contact and mirror system; and
   a bonding metal is evaporated over the mirror system and achieves bonding effect by applying a high temperature and a high pressure.

4. The method of claim 3, wherein: the high temperature is 250-350° C., and the high pressure is 60-200 KPa.

5. A method of selecting high-brightness light-emitting diodes (LEDs), the method comprising:
   (1) selecting an epitaxial wafer with a surface roughened;
   (2) measuring a total roughened surface area of a light-emitting surface on the epitaxial wafer selected in Step (1);
   (3) calculating a ratio of the total roughened surface area to a vertically projected area;
   (4) selecting epitaxial wafers with the ratio of not less than 1.5; and
   (5) fabricating LEDs with the epitaxial wafers selected in Step (4);
   wherein for the LEDs:
   the light-emitting surface has a surface microstructure; and
   a ratio of total roughened surface area of the light-emitting surface to a vertically-projected area is not less 1.5.

6. The method of claim 5, wherein the fabricating comprises:
   (a) exposing a light-emitting surface of an epitaxial wafer of the LED to be roughened, and protecting the light-emitting surface not-to-be roughened with a photoresist or metal;
   (b) preparing a roughening solution based on dose proportions in weight percentages as:

| | |
|---|---|
| $CH_3COOH$ | 30~50% |
| HF | 40~60% |
| $H_2SO_4$ | 0~2% |
| $HNO_3$ | 0~20% |
| H3PO4 | 0~10% |

(c) dipping the epitaxial wafer processed by Step (1) in the roughening solution prepared by Step (2) for 1-8 min.

7. The method of claim 6, wherein the fabricating further comprises: drying the epitaxial wafer for subsequent preparation of the LED.

8. The method of claim 6, wherein:
   the epitaxial wafer processed by Step (a) comprises a high reflection metal surface with electric contact and mirror system; and
   a bonding metal is evaporated over the mirror system and achieves bonding effect by applying a high temperature and a high pressure.

9. The method of claim 8, wherein: the high temperature is 250-350° C., and the high pressure is 60-200 KPa.

10. The method of claim 5, wherein a peak density of the light-emitting surface is not less than $0.3/um^2$.

11. The method of claim 10, wherein:
    the light-emitting surface is of a layer that is Al doped GaInP layer or Mg doped GaP layer, and
    in the Al doped GaInP layer, a mol ratio of Al to GaInP is 0.67-1.5.

* * * * *